(12) United States Patent
Lee et al.

(10) Patent No.: US 12,176,305 B2
(45) Date of Patent: *Dec. 24, 2024

(54) SEMICONDUCTOR PACKAGE WITH INTEGRATED VOLTAGE REGULATOR DEVICE AND SEPARATE BRIDGE DIE

(71) Applicant: Advanced Semiconductor Engineering, Inc., Kaohsiung (TW)

(72) Inventors: Pao-Nan Lee, Kaohsiung (TW); Chen-Chao Wang, Kaohsiung (TW); Chang Chi Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 27 days.

This patent is subject to a terminal disclaimer.

(21) Appl. No.: 17/676,093

(22) Filed: Feb. 18, 2022

(65) Prior Publication Data
US 2023/0268293 A1    Aug. 24, 2023

(51) Int. Cl.
H01L 21/768     (2006.01)
H01L 23/00      (2006.01)
H01L 23/31      (2006.01)
H01L 23/367     (2006.01)
H01L 23/495     (2006.01)
H01L 23/498     (2006.01)
H01L 23/522     (2006.01)
H01L 23/528     (2006.01)
H01L 23/532     (2006.01)
H01L 23/64      (2006.01)
H01L 25/065     (2023.01)

(52) U.S. Cl.
CPC ........ H01L 23/645 (2013.01); H01L 25/0652 (2013.01); H01L 25/0657 (2013.01)

(58) Field of Classification Search
CPC ............... H01L 23/645; H01L 25/0652; H01L 25/0657
See application file for complete search history.

(56) References Cited

U.S. PATENT DOCUMENTS

| | | | |
|---|---|---|---|
| 2009/0079530 A1* | 3/2009 | Chandrasekhar | H01F 41/041 336/200 |
| 2019/0051449 A1* | 2/2019 | Cappabianca | H01F 17/06 |
| 2019/0304915 A1* | 10/2019 | Jain | H01L 28/40 |
| 2020/0027639 A1* | 1/2020 | Goh | G05F 1/56 |
| 2020/0381392 A1* | 12/2020 | Yu | H10B 63/84 |
| 2021/0004032 A1* | 1/2021 | Mozipo | H03K 17/22 |
| 2021/0296241 A1* | 9/2021 | Sain | H01L 23/5385 |
| 2023/0060727 A1* | 3/2023 | Radhakrishnan | H01L 24/73 |
| 2023/0093186 A1* | 3/2023 | Ibrahim | H01L 24/24 257/690 |
| 2023/0163098 A1* | 5/2023 | Elsherbini | H01L 25/0652 257/532 |

* cited by examiner

Primary Examiner — Kretelia Graham
Assistant Examiner — Tenley H Schofield
(74) Attorney, Agent, or Firm — FOLEY & LARDNER LLP

(57) ABSTRACT

An electronic device is disclosed. The electronic device includes a first electronic component and a power regulating structure configured to provide a first power to the first electronic component. The power regulating structure includes a first component and a second component at least partially overlapped with the first component from a top view.

7 Claims, 14 Drawing Sheets

SEMICONDUCTOR PACKAGE WITH INTEGRATED VOLTAGE REGULATOR DEVICE AND SEPARATE BRIDGE DIE

BACKGROUND

1. Field of the Disclosure

The present disclosure generally relates to an electronic device.

2. Description of the Related Art

A power regulating device can be integrated within a package to miniaturize the size of an electronic device and to provide different types of power control for components in the package.

The power routing path for the power regulating device is usually provided by a substrate and/or package routing features (such as conductive vias and pads) in the package. A long power routing path through the substrate may cause a significant voltage drop and degrade the performance of the power routing path. When input voltage decreases, voltage drops may become an issue.

SUMMARY

In some embodiments, an electronic device includes a first electronic component and a power regulating structure configured to provide a first power to the first electronic component. The power regulating structure includes a first component and a second component at least partially overlapped with the first component from a top view.

In some embodiments, an electronic device includes a stacked structure having a first passive component and a second passive component. The electronic device also includes a first electronic component disposed above the stacked structure and configured to receive power from the stacked structure. The electronic device also includes a second electronic component at least partially under the first electronic component. A power path pass between the stacked structure and the first electronic component and a non-power path pass between the second electronic component and the first electronic component.

In some embodiments, an electronic device includes a power regulating component and a stacked structure having a first passive component and a second passive component. At least a part of the stacked structure is disposed over the power regulating component and configured to receive power from the power regulating component.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1A:
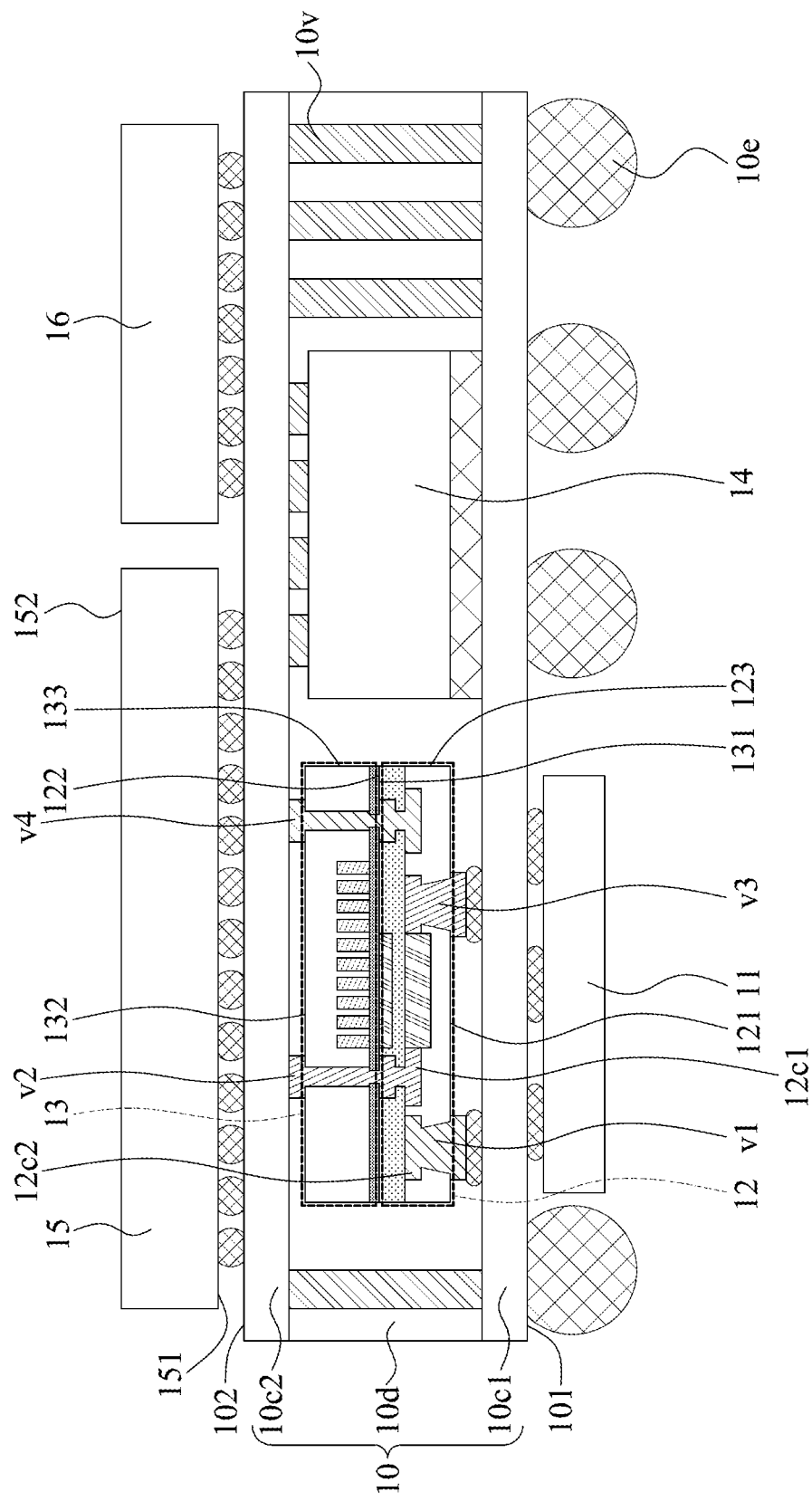
FIG. 1A illustrates a cross-sectional view of an example of an electronic device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1A illustrates a cross-sectional view of an example of an electronic device 1 according to some embodiments of the present disclosure. In some embodiments, the electronic device 1 may include a package, such as a semiconductor device package. In some embodiments, the electronic device 1 may include a carrier 10, a power regulating device 11, passive devices 12, 13, and active devices 14, 15, and 16.

In some embodiments, the carrier 10 may include, for example, a printed circuit board (PCB), such as a paper-based copper foil laminate, a composite copper foil laminate, or a polymer-impregnated glass-fiber-based copper foil laminate. In some embodiments, the carrier 10 may include a core layer and a conductive material and/or structure disposed on an upper surface and a bottom surface of the carrier 10. For example, the carrier 10 may include a dielectric layer 10*d* and circuit layers 10*c*1 and 10*c*2 disposed on opposite sides of the dielectric layer 10*d*.

In some embodiments, the dielectric layer 10d may include an encapsulant or an encapsulating layer. In some embodiments, the dielectric layer 10d may include an epoxy resin having fillers, a molding compound (e.g., an epoxy molding compound or another molding compound), a polyimide, a phenolic compound or material, a material with a silicone dispersed therein, or a combination thereof. The dielectric layer 10d may connect the circuit layers 10c1 and 10c2. The dielectric layer 10d may contact the circuit layers 10c1 and 10c2. In some embodiments, the circuit layers 10c1 and 10c2 may each include a redistribution layer (RDL). In some embodiments, the circuit layers 10c1 and 10c2 may each include conductive traces. In some embodiments, the circuit layers 10c1 and 10c2 may each provide a fan-out horizontal electrical path for the carrier 10. The circuit layer 10c1 may separate the power regulating device 11 from the passive devices 12 and 13. The circuit layer 10c1 may separate the power regulating device 11 from the active device 14. The circuit layer 10c2 may separate the active device 15 from the passive devices 12 and 13. The circuit layer 10c2 may separate the active device 15 from the active device 14.

In some embodiments, a conductive via 10v may extend through the dielectric layer 10d. In some embodiments, the conductive via 10v may be electrically connected with the circuit layers 10c1 and 10c2. In some embodiments, the conductive via 10v may provide a signal routing path (or a signal path) between the circuit layers 10c1 and 10c2.

In some embodiments, the carrier 10 may provide power and/or ground connections to the devices or components electrically connected with the carrier 10. For example, the carrier 10 may have a connector or terminal configured to be electrically connected with a power source or a power supply (not illustrated in the figures). The carrier 10 may provide a power routing path (or a power path) (such as through the circuit layer 10c1) between the power supply and the power regulating device 11. In addition, the carrier 10 may provide a power path (such as through the circuit layer 10c1, the passive devices 12 and 13, and the circuit layer 10c2) between the power regulating device 11 and the active device (such as the active device 15) to provide regulated power to the active device electrically connected with the carrier 10.

As used herein, a signal path may refer to a path through which an electrical signal may be transmitted. Such an electrical signal may include either analog or digital signals. Additionally, a power path, as used and described herein, may refer to a path dedicated to power supply connections.

In some embodiments, the carrier 10 may include a surface 101 and a surface 102 opposite to the surface 101. The carrier 10 may include one or more conductive pads (not shown) in proximity to, adjacent to, or embedded in and exposed from the surface 101 and/or 102 of the carrier 10. The carrier 10 may include a solder resist (not shown) on the surface 101 and/or 102 of the carrier 10 to fully expose or to expose at least a portion of the conductive pads for electrical connections, including, for example, the power path and the signal path in the electronic device 1.

In some embodiments, an electrical contact 10e may be disposed on the surface 101 of the carrier 10, and can provide electrical connections between the electronic device 1 and external components (e.g., external circuits or circuit boards). In some embodiments, the electrical contact 10e may include a connector. In some embodiments, the electrical contact 10e may include a solder ball, such as a controlled collapse chip connection (C4) bump, a ball grid array (BGA) or a land grid array (LGA).

In some embodiments, the power regulating device 11 may be disposed on the surface 101 of the carrier 10. In some embodiments, the power regulating device 11 may include a power management integrated circuit (PMIC). In some embodiments, the power regulating device 11 may be configured to provide different types of power control to different parts of the electronic device 1. For example, the power regulating device 11 may be configured to provide regulated power to the active devices 14, 15, and/or 16. For example, the power regulating device 11 may be configured to provide different output voltages to the active devices 14, 15, and/or 16.

In some embodiments, the power regulating device 11 may include a voltage regulator, such as a linear regulator (which is configured to maintain a constant output voltage) or a switching regulator (which is configured to generate an output voltage higher than or lower than the input voltage).

In some embodiments, the power regulating device 11 may include a step-down (buck) converter, a step-up (boost) converter, an analog-to-digital converter, a digital-to-analog converter, an AC-DC converter, a DC-DC converter, other types of converters, or a combination thereof.

In some embodiments, the power regulating device 11 may be operated in a frequency higher than about 1 megahertz (MHz), such as about 100 MHz. In some embodiments, the power regulating device 11 with a higher operating frequency or switching frequency may be compatible with the active device 15 with a higher operating frequency or switching frequency. In some embodiments, by using a higher operating frequency or switching frequency, the inductance value and the capacitance value of the passive devices 12 and 13 can be lower. Therefore, smaller passive devices 12 and 13 can be used.

In some embodiments, the passive devices (or passive components) 12 and 13 may be disposed within the carrier 10. In some embodiments, the passive devices 12 and 13 may be integrated within the carrier 10. For example, the passive devices 12 and 13 may be disposed between the circuit layers 10c1 and 10c2. For example, the passive devices 12 and 13 may be disposed within the dielectric layer 10d. For example, the passive devices 12 and 13 may be covered, surrounded, or encapsulated by the dielectric layer 10d.

In some embodiments, the passive devices 12 and 13 may be integrated or combined as a monolithic component. For example, the passive devices 12 and 13 may be formed as a monolithic component before being disposed in the carrier 10. In some embodiments, the passive device 13 may be stacked on the passive device 12. In some embodiments, the passive device 13 may be in contact with the passive device 12. For example, the passive device 13 may directly contact the passive device 12.

In some embodiments, the passive device 12 may include a bottom surface 121 facing the circuit layer 10c1, a top surface 122 opposite to the bottom surface 121, and a lateral surface 123 extending between the bottom surface 121 and the top surface 122.

In some embodiments, the passive device 13 may include a bottom surface 131 facing the circuit layer 10c1, a top surface 132 opposite to the bottom surface 131, and a lateral surface 133 extending between the bottom surface 131 and the top surface 132. In some embodiments, the bottom surface 131 of the passive device 13 may directly contact the top surface 122 of the passive device 12. In some embodiments, the lateral surface 133 of the passive device 13 and the lateral surface 123 of the passive device 12 may be substantially coplanar.

The passive devices 12 and 13 may be circuits or circuit elements that do not need an external power source to function and do not provide electrical gain. In some embodiments, the passive devices 12 and 13 may be present in the power paths between the power regulating device 11 and the active devices 14, 15, and/or 16.

In some embodiments, the passive devices 12 and 13 may be passive devices of different types. For example, the passive device 12 may be an inductance device (or an inductor) and the passive device 13 may be a capacitance device (or capacitor), or vice versa. Other examples of passive devices may include, for example, resistors, diodes, fuses or antifuses, etc., and may be included along with the passive devices 12 and 13 in any combination as part of the carrier 10.

In some embodiments, the passive devices 12 and 13 may be referred to as an integrated passive device. In some embodiments, the passive devices 12 and 13 may be referred to as a power regulating structure or a stacked structure. The power regulating structure includes at least two different types of components or devices.

In some embodiments, the active device 14 may be disposed within the carrier 10. In some embodiments, the active device 14 may be integrated within the carrier 10. For example, the active device 14 may be disposed between the circuit layers 10c1 and 10c2. For example, the active device 14 may be disposed within the dielectric layer 10d. For example, the active device 14 may be covered, surrounded, or encapsulated by the dielectric layer 10d. In some embodiments, active device 14 may be spaced apart from the passive devices 12 and 13.

In some embodiments, the active devices 15 and 16 may be disposed on the surface 102 of the carrier 10. In some embodiments, the active devices 15 and 16 may be electrically connected with the carrier 10 (such as with the circuit layer 10c2) through an electrical contact, such as solder balls.

In some embodiments, the active devices 14, 15, and 16 may be electronic components. In some embodiments, the active devices 14, 15, and 16 may be circuits or circuit elements that rely on an external power supply to control or modify electrical signals. For example, the active devices 14, 15, and 16 may each include a processor, a controller, a memory, or an input/output (I/O) buffer, etc. For example, the active device 15 may include a system on chip (SoC). For example, the active device 15 may include a central processing unit (CPU), a microprocessor unit (MPU), a graphics processing unit (GPU), a microcontroller unit (MCU), an application-specific integrated circuit (ASIC), a field-programmable gate array (FPGA), or another type of integrated circuit. For example, the active device 16 may include a memory, such as a high bandwidth memory (HBM).

In some embodiments, the active device 16 may be electrically connected with the active device 15 through the active device 14 and the circuit layer 10c2. For example, the active device 14 may include a bridge die. For example, the active device 16 and the active device 15 may be electrically coupled by the active device 14. For example, the active device 14 may be configured to provide a non-power path (such as a signal path) between the active device 16 and the active device 15. For example, the active device 14 may be connected with input/output (I/O) bumps between the active device 16 and the active device 15. In some embodiments, the active device 14 may be configured to reduce signal loss and enhance power efficiency between the active device 16 and the active device 15.

The locations and number of the active devices in the electronic device 1 are not intended to limit the present disclosure. For example, there may be any number of the active devices on any location in the electronic device 1 due to design requirements.

In some embodiments, the active device 15 may include a surface 151 facing the carrier 10 and a surface 152 opposite to the surface 151. In some embodiments, the surface 151 may include an active surface and the surface 152 may include a backside surface.

In some embodiments, an electrical signal may be transmitted through the active surface (e.g., the surface 151) of the active device 15. For example, a signal path may pass through the active surface (e.g., the surface 151) of the active device 15. For example, the surface 151 may include a circuit region configured to transmit a signal to the carrier 10 and/or to receive a signal from the carrier 10. For example, a non-power path (such as a signal path) may exist between the active device 15 and the active device 14.

In some embodiments, a power may be transmitted through the active surface (e.g., the surface 151) of the active device 15. For example, a power path may pass through the active surface (e.g., the surface 151) of the active device 15. For example, the surface 151 may include a circuit region configured to receive a power from the power regulating device 11 through the carrier 10. For example, a power path may exist between the power regulating device 11 and the active device 14. For example, a power path may exist between the passive devices 12, 13 and the active device 14. In other words, a signal path and a power path may both pass through the active surface (e.g., the surface 151) of the active device 15.

In some embodiments, the power regulating device 11, the passive devices 12 and 13, and the active device 15 may be at least partially overlapped in a direction substantially perpendicular to the surface 101 and/or 102 of the carrier 10. In some embodiments, the power path between the power regulating device 11 and the active device 15 may be substantially perpendicular to the surface 101 and/or 102 of the carrier 10. For example, the regulated power transmitted or conducted between the power regulating device 11 and the active device 15 may be substantially along a direction substantially perpendicular to the surface 101 and/or 102 of the carrier 10.

In some embodiments, the regulated power from the power regulating device 11 may be transmitted or conducted to the active device 15 through the circuit layer 10c1, the passive device 12, the passive device 13, and the circuit layer 10c2 sequentially.

Specifically, the regulated power transmitted or conducted between the power regulating device 11 and the circuit layer 10c1 may be along a direction substantially perpendicular to the surface 101 and/or 102 of the carrier 10. The regulated power transmitted or conducted between the circuit layer 10c1 and the passive device 12 may be along a direction substantially perpendicular to the surface 101 and/or 102 of the carrier 10. The regulated power transmitted or conducted between the passive device 12 and the passive device 13 may be along a direction substantially perpendicular to the surface 101 and/or 102 of the carrier 10. The regulated power transmitted or conducted between the passive device 13 and the circuit layer 10c2 may be along a direction substantially perpendicular to the surface 101 and/or 102 of the carrier 10. The regulated power transmitted or conducted between the circuit layer 10c2 and the active device 15 may be along a direction substantially perpendicular to the surface 101 and/or 102 of the carrier 10.

For example, the passive device 12 may be electrically connected with the power regulating device 11 through conductive vias v1 and v3. The conductive vias v1 and v3 may extend through a part of the passive device 12.

For example, the passive device 12 may be electrically connected with the passive device 13 through conductive vias v2 and v4. The conductive vias v2 and v4 may extend through a part of the passive device 13. For example, the regulated power may be transmitted or conducted between the passive device 12 and the passive device 13 through the conductive vias v2 and v4. For example, the regulated power may be transmitted or conducted between the passive device 12 and the passive device 13 without passing through the circuit layer 10c1 of the carrier 10.

According to some embodiments of the present disclosure, by stacking the passive device 12 and the passive device 13, the power path can be shorter than if the passive device 12 and the passive device 13 are disposed side-by-side. Therefore, the voltage drop of the power path can be decreased and the supply power for the power regulating device 11 can be lower. In addition, the electronic device 1 can be further miniaturized.

Furthermore, since the passive devices 12 and 13 (and other passive devices, if any, for routing the power path) are formed as a monolithic component before being disposed in the carrier 10, the production rate and the manufacturing yield can be increased.

Figure 1B:
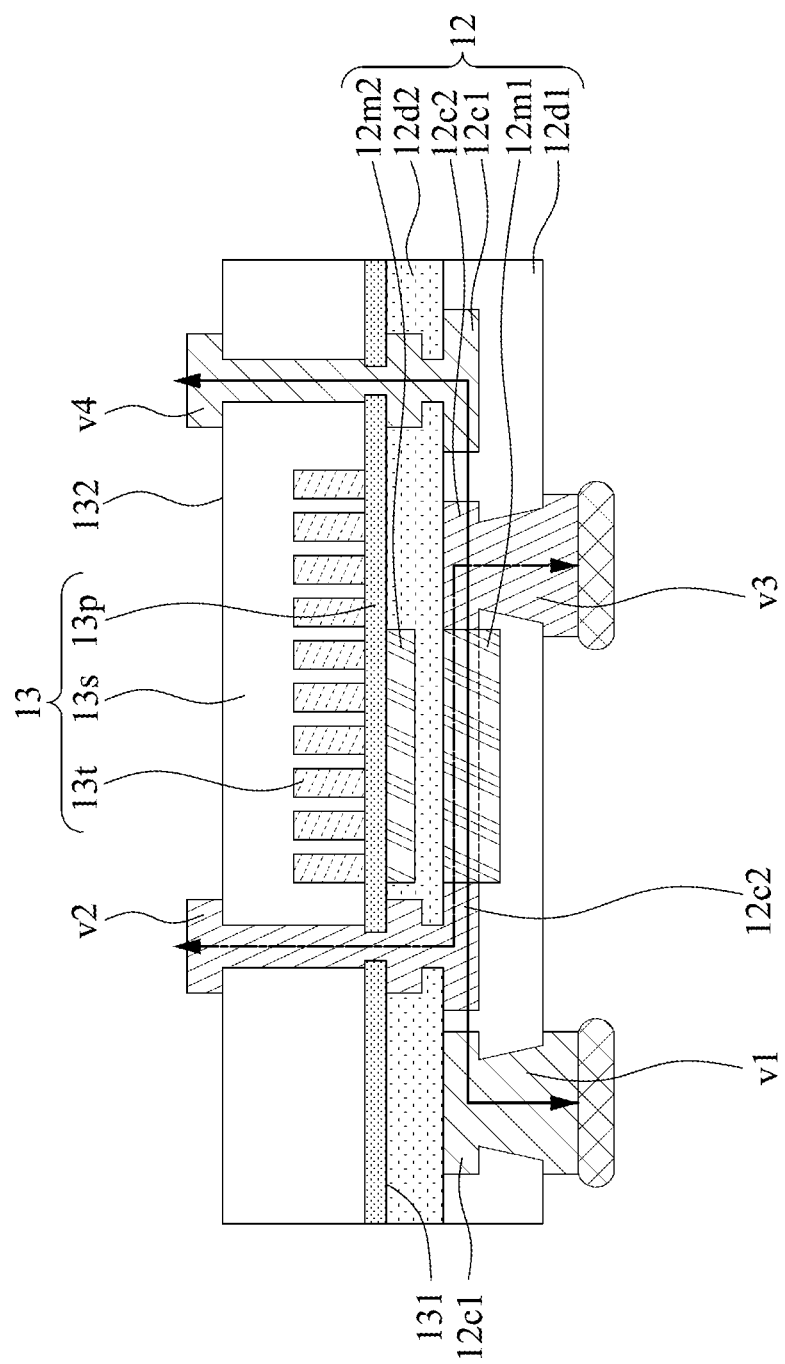
FIG. 1B illustrates a cross-sectional view of an example of a part of an electronic device according to some embodiments of the present disclosure.
Figure 1C:
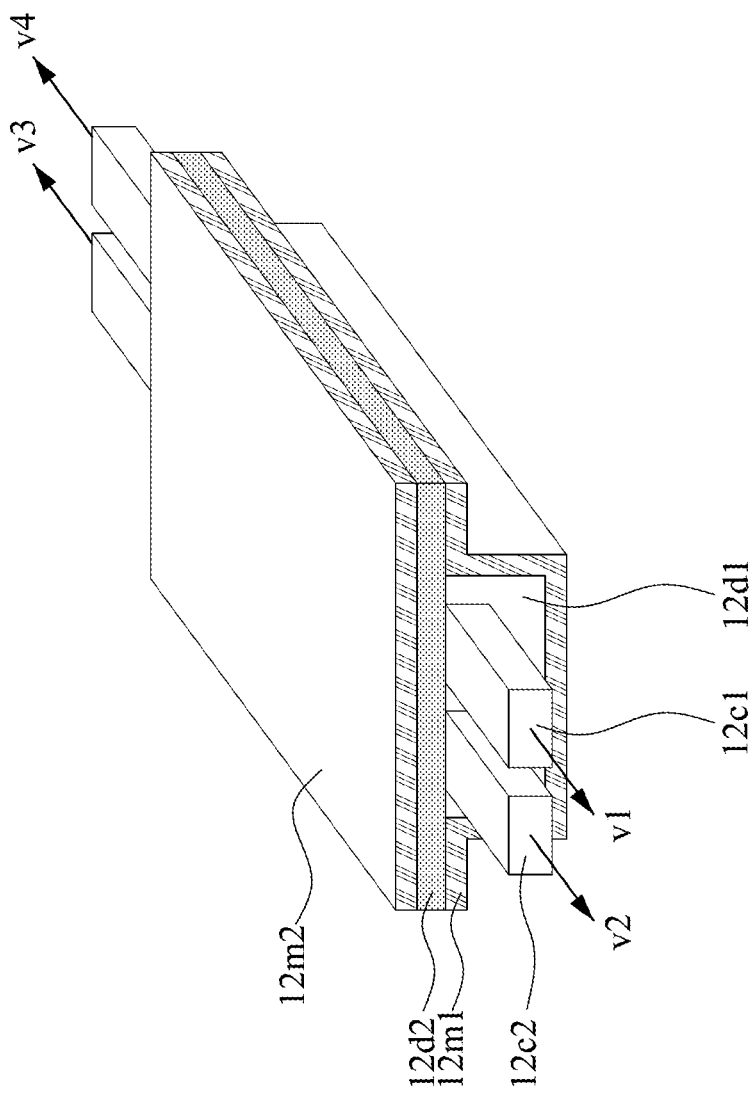
FIG. 1C illustrates a perspective view of an example of a passive device according to some embodiments of the present disclosure.

FIG. 1B illustrates a cross-sectional view of an example of a part of an electronic device according to some embodiments of the present disclosure. In some embodiments, the structure illustrated in FIG. 1B may be a part of the electronic device 1 in FIG. 1A. FIG. 1C illustrates a perspective view of an example of the passive device 12 according to some embodiments of the present disclosure.

Referring to FIG. 1B and FIG. 1C, in some embodiments, the passive device 12 may include magnetic materials 12m1, 12m2, dielectric layers 12d1, 12d2, and conductive elements 12c1, 12c2.

In some embodiments, the magnetic material 12m2 may be in contact with the passive device 13. The magnetic material 12m2 may be covered by the dielectric layer 12d2. The magnetic material 12m1 may be spaced apart from the magnetic material 12m2 by the dielectric layer 12d2. In some embodiments, the magnetic materials 12m1 and 12m2 may surround a part of the conductive element 12c. For example, the magnetic materials 12m1 and 12m2 may at least partially enclose the conductive elements 12c1 and 12c2.

In some embodiments, the magnetic materials 12m1 and 12m2 may each include a thin film. The magnetic materials 12m1 and 12m2 may each include a ferromagnetic material, such as Fe, Co, Ni, or other suitable materials.

In some embodiments, the conductive elements 12c1 and 12c2 may be disposed between the magnetic materials 12m1 and 12m2. In some embodiments, the conductive elements 12c1 and 12c2 may be disposed between the dielectric layers 12d1 and 12d2. In some embodiments, the conductive elements 12c1 and 12c2 may be partially covered, surrounded, or enclosed by the dielectric layers 12d1 and 12d2. In some embodiments, the conductive elements 12c1 and 12c2 may be elongated in a direction. For example, the conductive elements 12c1 and 12c2 may each be formed in a straight line. In some embodiments, the conductive element 12c1 may extend out of the magnetic materials 12m1 and 12m2 to connect conductive vias v1 and v4. The conductive via v1 is electrically connected with the power regulating device 11 in FIG. 1A. The conductive via v4 is electrically connected with the passive device 12 and the active device 15 in FIG. 1A. The conductive element 12c2 may extend out of the magnetic materials 12m1 and 12m2 to connect conductive vias v2 and v3. The conductive via v3 is electrically connected with the power regulating device 11 in FIG. 1A. The conductive via v2 is electrically connected with the passive device 12 and the active device 15 in FIG. 1A.

The numbers of the conductive elements 12c1 and 12c2 are not limited thereto. For example, there may be more conductive elements in the passive device 12. In some embodiments, the conductive elements 12c1 and 12c2 may include conductive materials, such as copper (Cu), tin (Sn), aluminum (Al), gold (Au), silver (Ag), tungsten (W), nickel (Ni), or other suitable materials.

In some embodiments, the dielectric layer 12d2 may be disposed on the passive device 13 to cover the magnetic material 12m2. The dielectric layer 12d1 may be disposed on the dielectric layer 12d2 to cover the magnetic material 12m1. In some embodiments, the dielectric layer 12d1 may fill up the space between the magnetic material 12m1 and the conductive element 12c.

In some embodiments, the dielectric layers 12d1 and 12d2 may include, for example, one or more organic materials (e.g., phosphoric anhydride (PA), a polyimide (PI), a polybenzoxazole (PBO), an epoxy, and an epoxy-based material)), or one or more inorganic materials (e.g., silicon, a glass, a ceramic, and an oxide).

In some embodiments, the passive device 13 may include a deep trench capacitor (DTC), a multi-layer ceramic capacitor (MLCC) or other capacitors. In some embodiments, the passive device 13 may include a substrate 13s (such as a silicon (Si) substrate or another semiconductor substrate)), a protection layer 13p, and a plurality of trenches 13t.

In some embodiments, the protection layer 13p may be or be a part of the surface 131 of the passive device 13. In some embodiments, the protection layer 13p may include, for example, silicon oxide ($SiO_x$), silicon nitride ($Si_3N_4$), or a combination thereof. The protection layer 13p may be configured to protect the substrate 13s. In some embodiments, the protection layer 13p may contact the passive device 12. In some embodiments, the trenches 13t may be adjacent to the protection layer 13p. In some embodiments, the trenches 13t may be closer to the surface 131 than to the surface 132. In some embodiments, the trenches 13t may be conductive trenches.

Figure 1D:
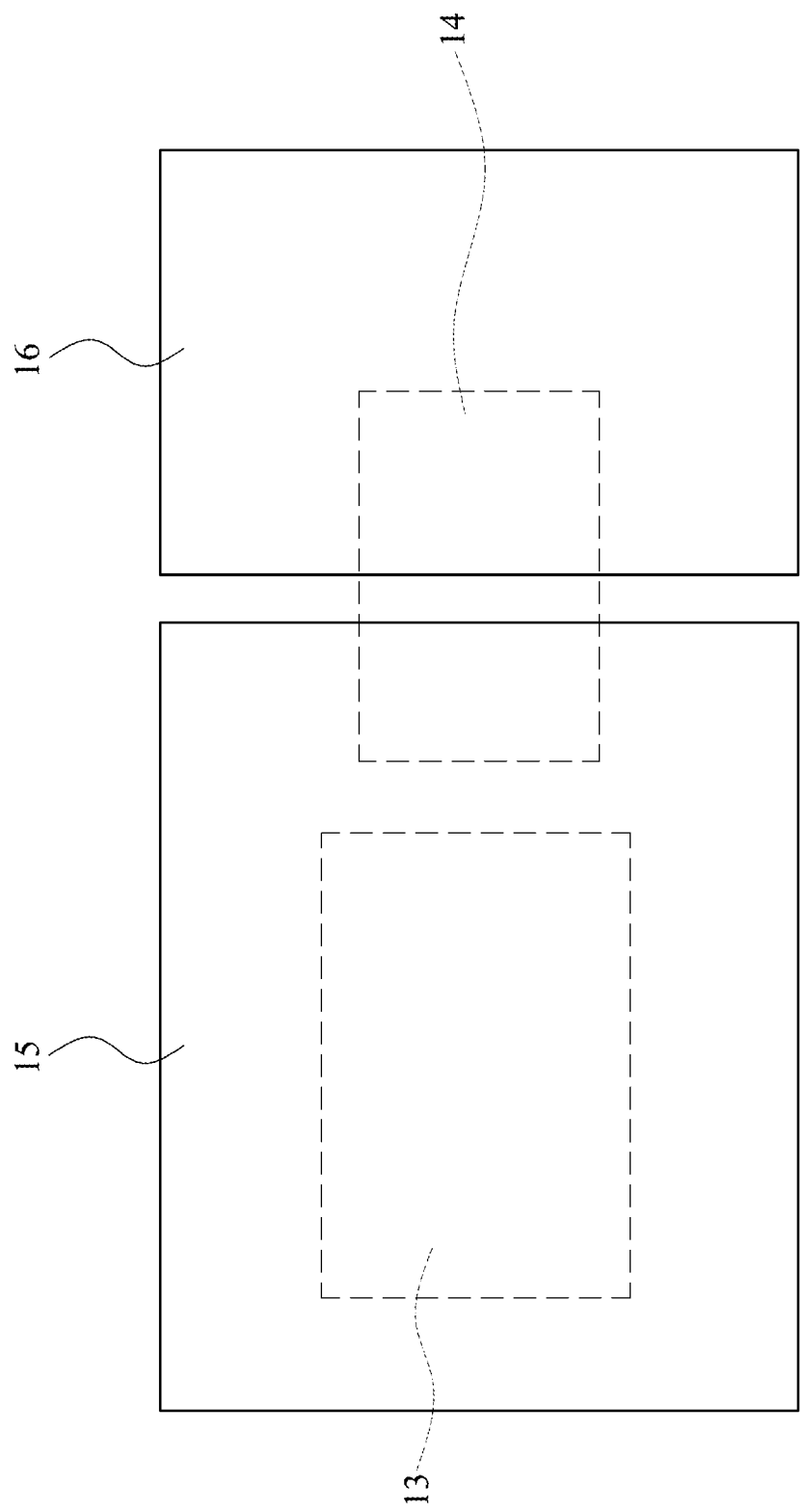
FIG. 1D illustrates a top view of an example of an electronic device according to some embodiments of the present disclosure.

FIG. 1D illustrates a top view of an example of an electronic device according to some embodiments of the present disclosure. In some embodiments, the top view in FIG. 1D may be a top view of the electronic device 1 in FIG. 1A. The passive device 12 is disposed under the passive device 13 and is blocked by the passive device 13.

As shown in FIG. 1D, a projection area of the passive devices 12 and 13 on the carrier 10 (shown in FIG. 1A) may be entirely within a projection area of the active device 15. For example, the passive devices 12 and 13 may be entirely under the active device 15 from a top view. The active device 14 may be partially under the active device 15 from a top view. For example, a part of the active device 14 may be covered by the active device 15 and a part of the active device 14 may be uncovered by the active device 15 from a top view.

Figure 2A:
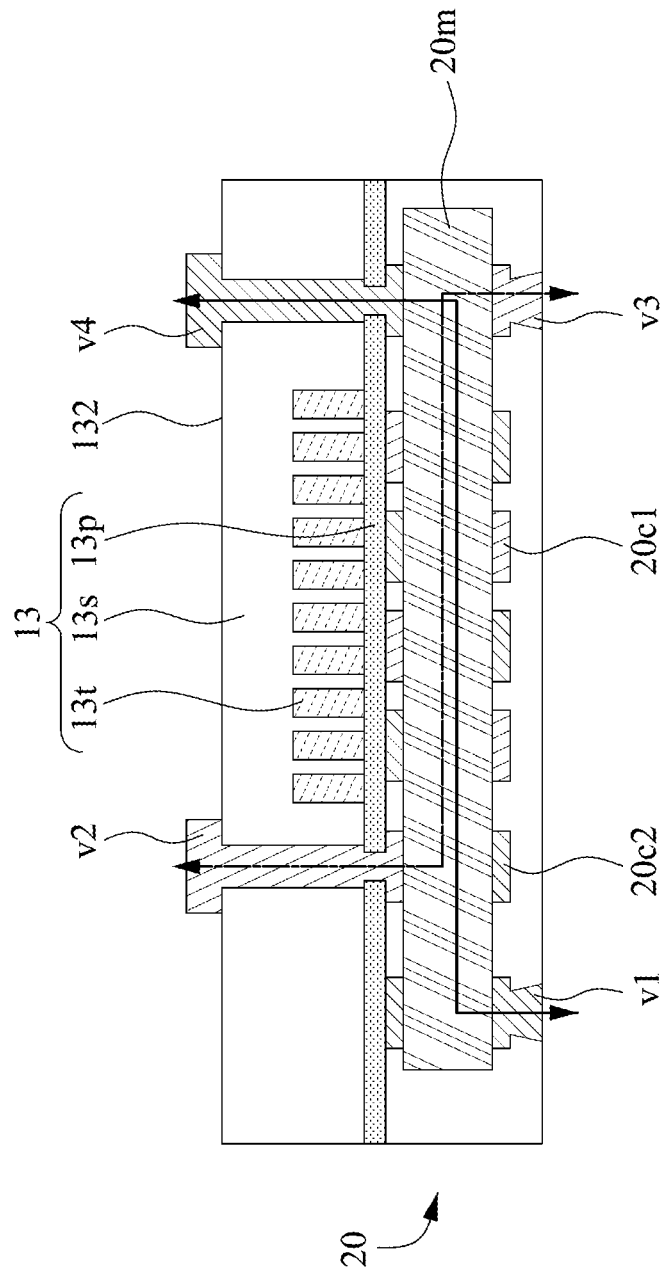
FIG. 2A illustrates a cross-sectional view of an example of a part of an electronic device according to some embodiments of the present disclosure.
Figure 2B:
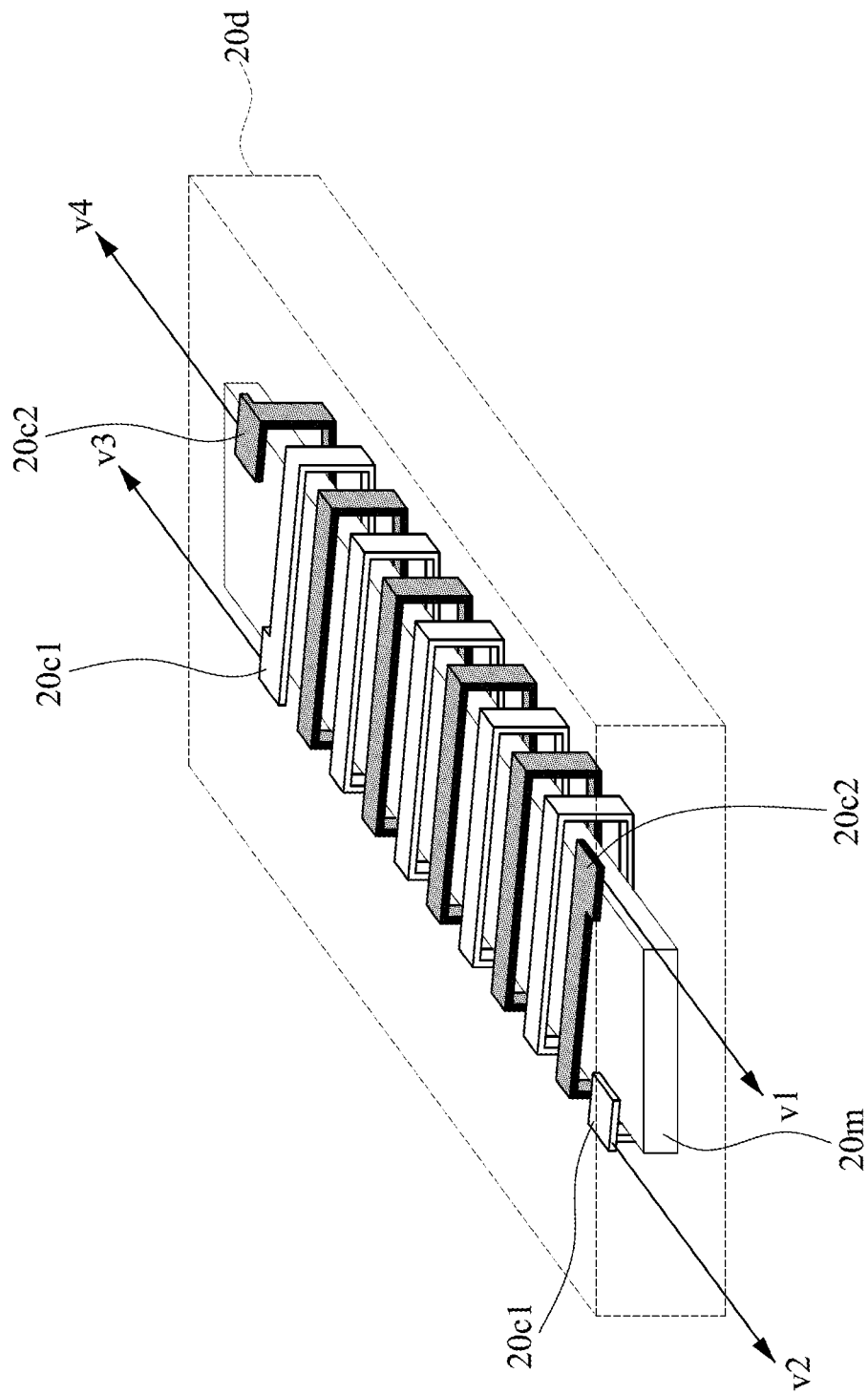
FIG. 2B illustrates a perspective view of an example of a passive device according to some embodiments of the present disclosure.

FIG. 2A illustrates a cross-sectional view of an example of a part of an electronic device according to some embodiments of the present disclosure. The structure illustrated in FIG. 2A includes a passive device 20 and may be a part of the electronic device 1 in FIG. 1A. FIG. 2B illustrates a perspective view of an example of the passive device 20 according to some embodiments of the present disclosure. In some embodiments, the passive device 12 of the electronic device 1 in FIG. 1A may be replaced with the passive device 20.

The passive device 20 may include conductive materials 20c1, 20c2, a dielectric layer 20d, and a magnetic element 20m.

In some embodiments, the conductive materials 20c1 and 20c2 may surround a part of the magnetic element 20m. For example, the conductive materials 20c1 and 20c2 may at least partially enclose the magnetic element 20m. In some embodiments, the conductive materials 20c1 and 20c2 may include conductive materials listed above for the conductive element 12c. In some embodiments, the conductive materials 20c1 and 20c2 may each include a conductive wire or coil winding around the magnetic element 20m.

In some embodiments, the conductive material 20c1 may be electrically connected with the conductive vias v2 and v3. The conductive via v3 is electrically connected with the power regulating device 11 in FIG. 1A. The conductive via v2 is electrically connected with the passive device 12 and the active device 15 in FIG. 1A.

The conductive material 20c2 may be electrically connected with the conductive vias v1 and v4. The conductive via v1 is electrically connected with the power regulating device 11 in FIG. 1A. The conductive via v4 is electrically connected with the passive device 12 and the active device 15 in FIG. 1A.

In some embodiments, the magnetic element 20m may be partially covered, surrounded, or enclosed by the dielectric layer 20d. In some embodiments, the magnetic element 20m may be elongated in a direction. For example, the magnetic element 20m may be formed in a straight line. In some embodiments, the magnetic element 20m may include a ferromagnetic material listed above for the magnetic materials 12m1 and 12m2.

Figure 3A:
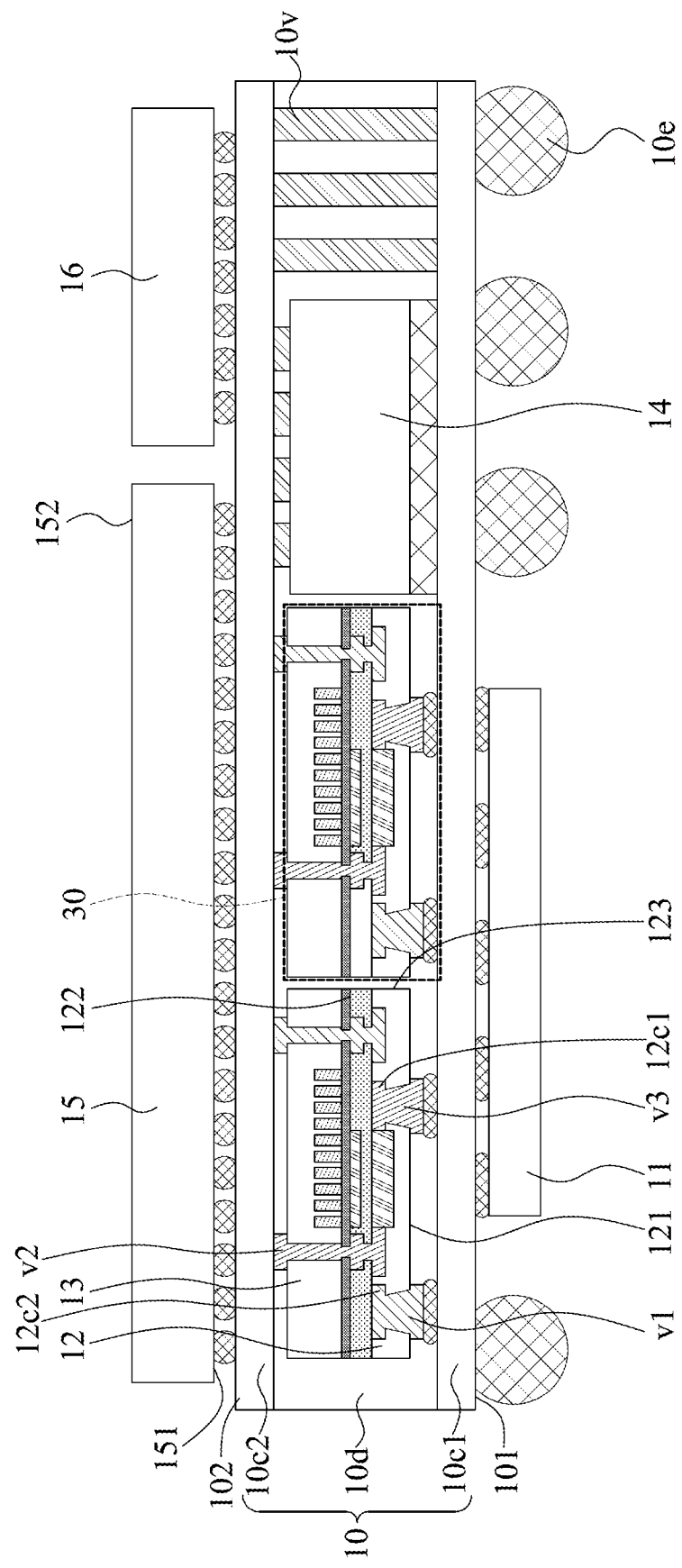
FIG. 3A illustrates a cross-sectional view of an example of an electronic device according to some embodiments of the present disclosure.

FIG. 3A illustrates a cross-sectional view of an example of an electronic device 3 according to some embodiments of the present disclosure. The electronic device 3 is similar to the electronic device 1 in FIG. 1A. Therefore, some detailed descriptions may refer to the corresponding paragraphs above and are not repeated hereinafter for conciseness.

The electronic device 3 may include an integrated passive device 30. The integrated passive device 30 may be disposed within the carrier 10. The integrated passive device 30 may be spaced apart from the passive devices 12 and 13 (i.e., another integrated passive device). The integrated passive device 30 may include an inductance device and a capacitance device. For example, the integrated passive device 30 may include the passive devices 12 and 13 in FIG. 1A.

Figure 3B:
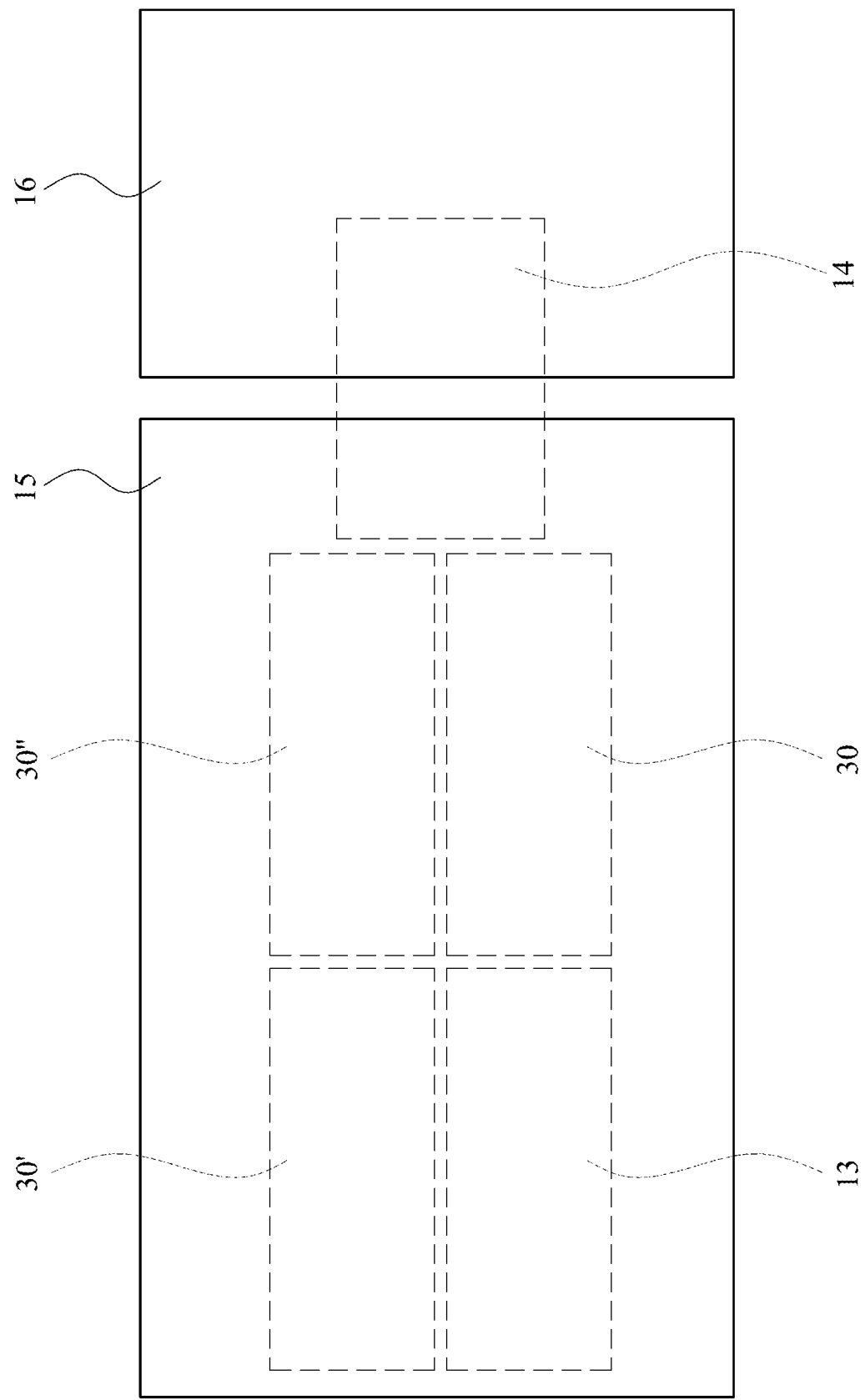
FIG. 3B illustrates a top view of an example of an electronic device according to some embodiments of the present disclosure.

FIG. 3B illustrates a top view of an example of an electronic device according to some embodiments of the present disclosure. In some embodiments, the top view in FIG. 3B may be a top view of the electronic device 3 in FIG. 3A.

As shown in FIG. 3B, a projection area of the passive device 13 (the passive device 12 is blocked by the passive device 13) and the integrated passive devices 30, 30', and 30'' on the carrier 10 (shown in FIG. 3A) may be entirely within a projection area of the active device 15.

In some embodiments, the number of the integrated passive devices is not limited thereto, and there may be any number of the integrated passive devices in the electronic device 3 depending on designed requirements.

FIGS. 4A, 4B, 4C, 4D, 4E, and 4F illustrate cross-sectional views in one or more stages of a method of manufacturing a part of an electronic device in accordance with an embodiment of the present disclosure. At least some of these figures have been simplified to better understand the aspects of the present disclosure. In some embodiments, a part of the electronic device 1 may be manufactured through the operations described with respect to FIGS. 4A, 4B, 4C, 4D, 4E, and 4F.

Figure 4A:
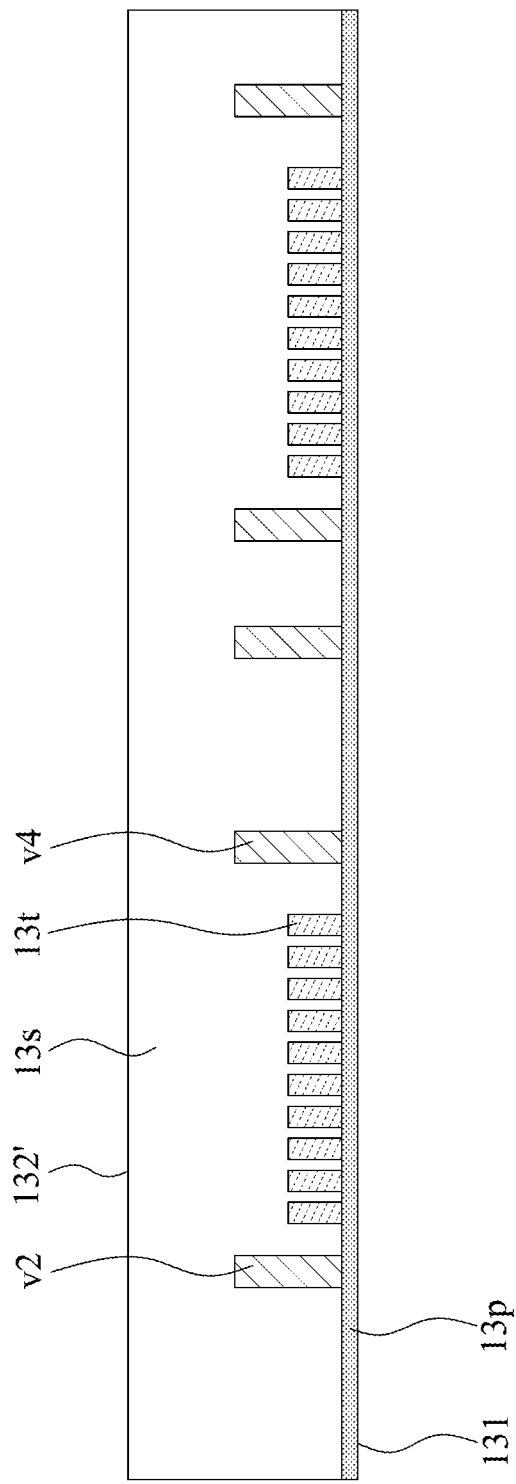
FIGS. 4A, 4B, 4C, 4D, 4E, and 4F illustrate cross-sectional views in one or more stages of a method of manufacturing a part of an electronic device in accordance with an embodiment of the present disclosure.

Referring to FIG. 4A, the substrate 13s may be provided. The substrate 13s may have the surface 131 and the surface 132' opposite to the surface 131. The protection layer 13p may be or be a part of the surface 131 of the passive device 13. The trenches 13t may be adjacent to the protection layer 13p.

In some embodiments, the substrate 13s may further include a part of the conductive vias v2 and v4, which may be configured to provide power connections.

In some embodiments, the substrate 13s may include several units which may be separable from each other by a scribe line (not shown). Since each of the units is subjected to similar or identical processes in the manufacturing method, for convenience, only two exemplary carrier units are illustrated and described in the following description.

Figure 4B:
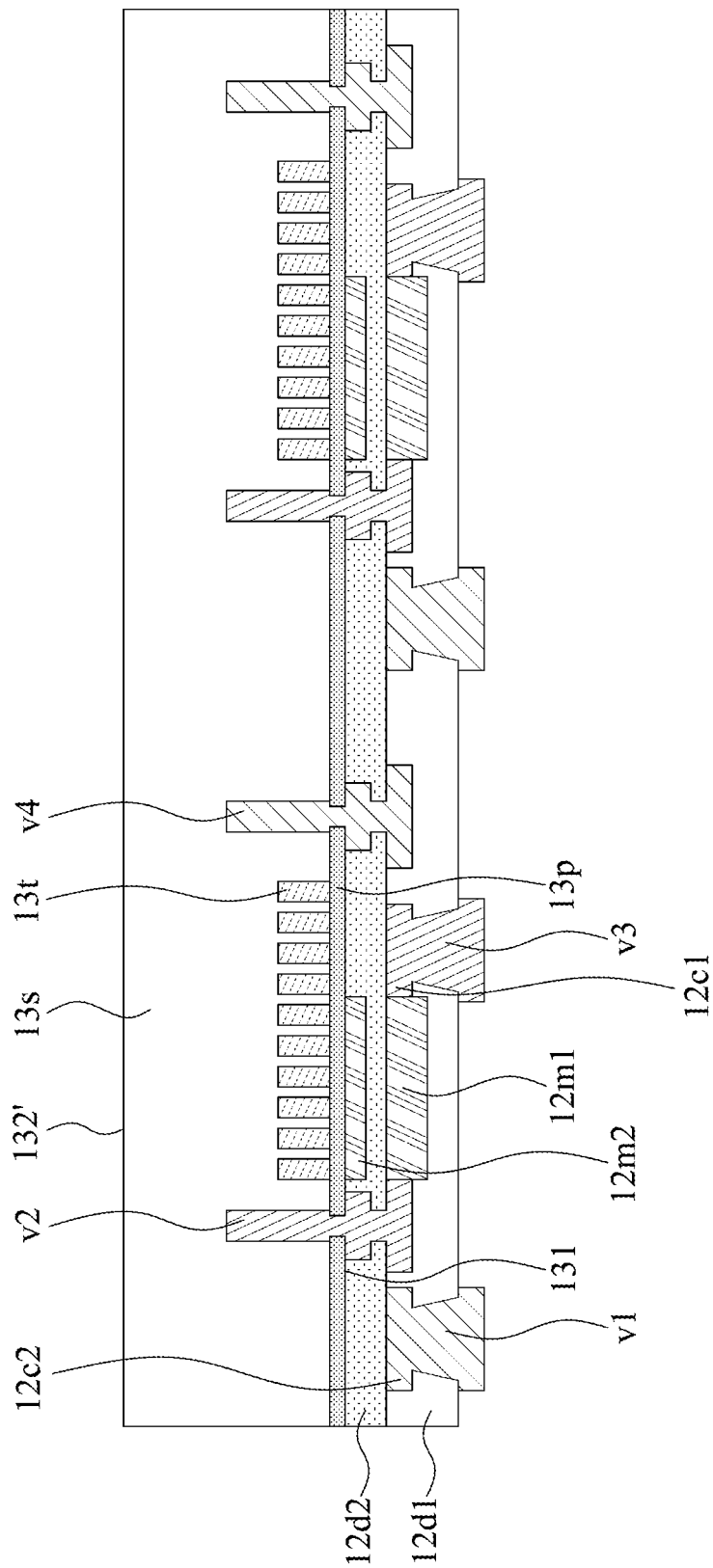

Referring to FIG. 4B, the passive device 12 may be formed. For example, the magnetic material 12m2 may be disposed on the surface 131 of the substrate 13s. The dielectric layer 12d2 may be disposed on the passive device 13 to cover the magnetic material 12m2. The conductive elements 12c1 and 12c2 may be disposed on the dielectric layer 12d2. Then, the magnetic material 12m1 may be disposed on the dielectric layer 12d2 to cover the conductive elements 12c1 and 12c2.

In some embodiments, the dielectric layers 12d2 and 12d1 may be formed by, for example, coating, lamination or other suitable processes. One or more openings may be formed in the dielectric layers 12d2 and 12d1 by, for example, a lithographic technique. The conductive vias v1, v2, v3, and v4 and the conductive element 12c may be formed on the exposed portion by, for example, plating.

Figure 4C:
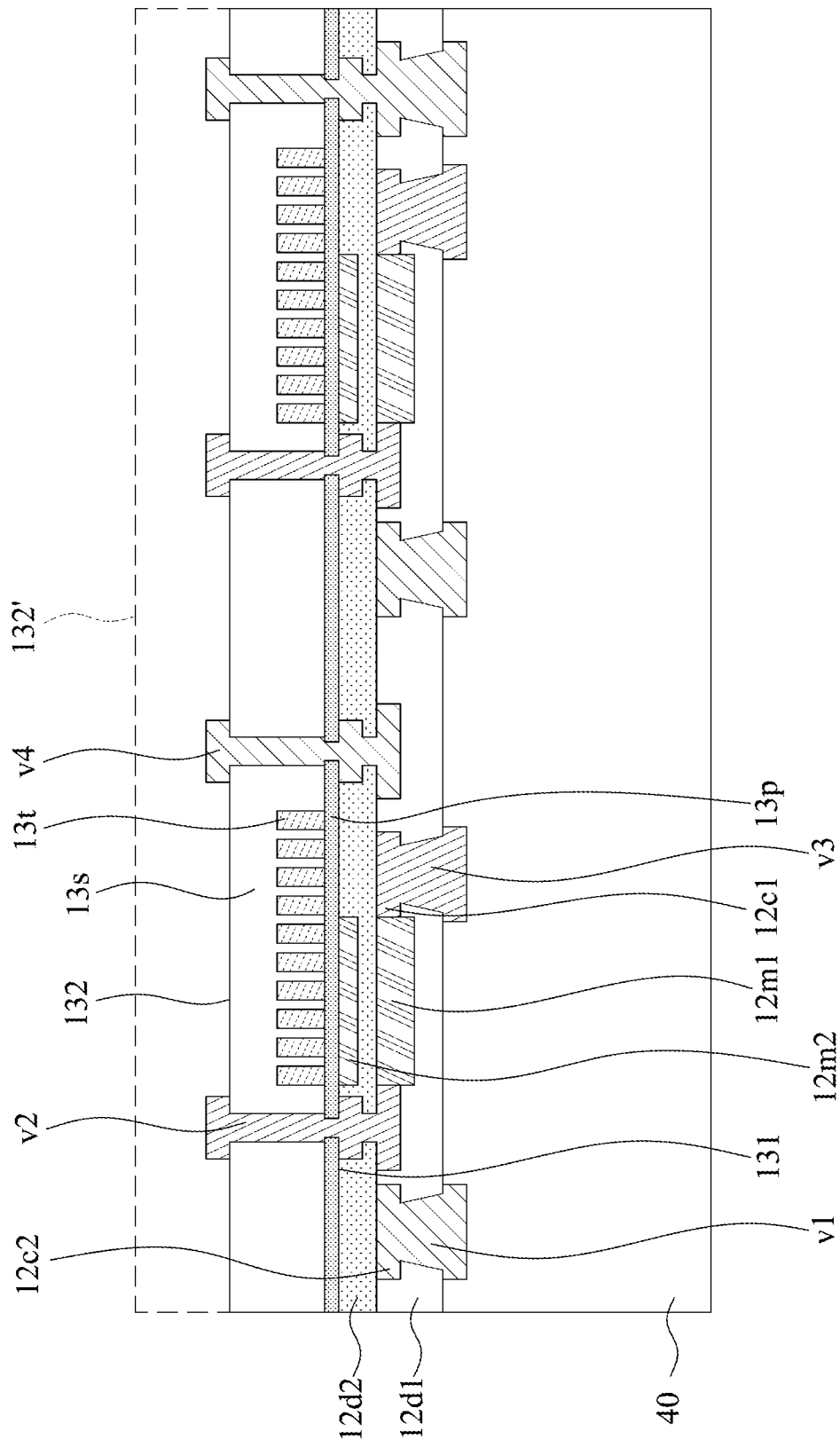

Referring to FIG. 4C, the structure obtained from the operation in FIG. 4B may be disposed on a carrier 40. A part of the substrate 13s may be removed to expose a part of the conductive via v2 and a part of the conductive via v4. The substrate 13s has a new surface 132. Conductive pads may be disposed on the surface 132 to contact the conductive vias v2 and v4. The conductive pads may facilitate electrical connections with the circuit layer 10c2 shown in FIG. 1A.

Figure 4D:
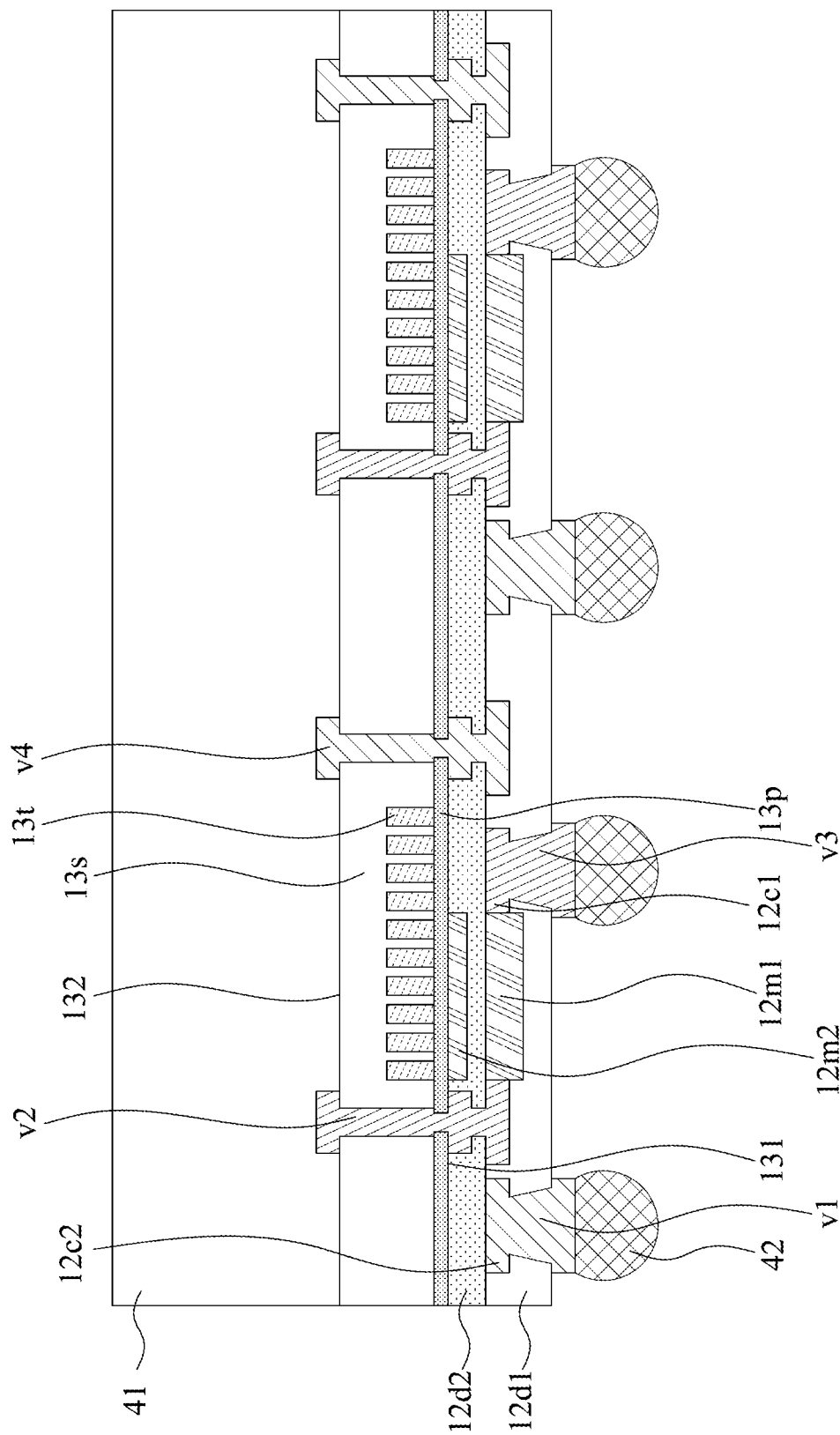

Referring to FIG. 4D, the structure obtained from the operation in FIG. 4C may be disposed on a carrier 41. The carrier 40 may be removed. Electrical contacts 42 may be disposed on ends of the conductive vias v1 and v3. The conductive contacts 42 may facilitate electrical connections with the circuit layer 10c1 shown in FIG. 1A.

Figure 4E:
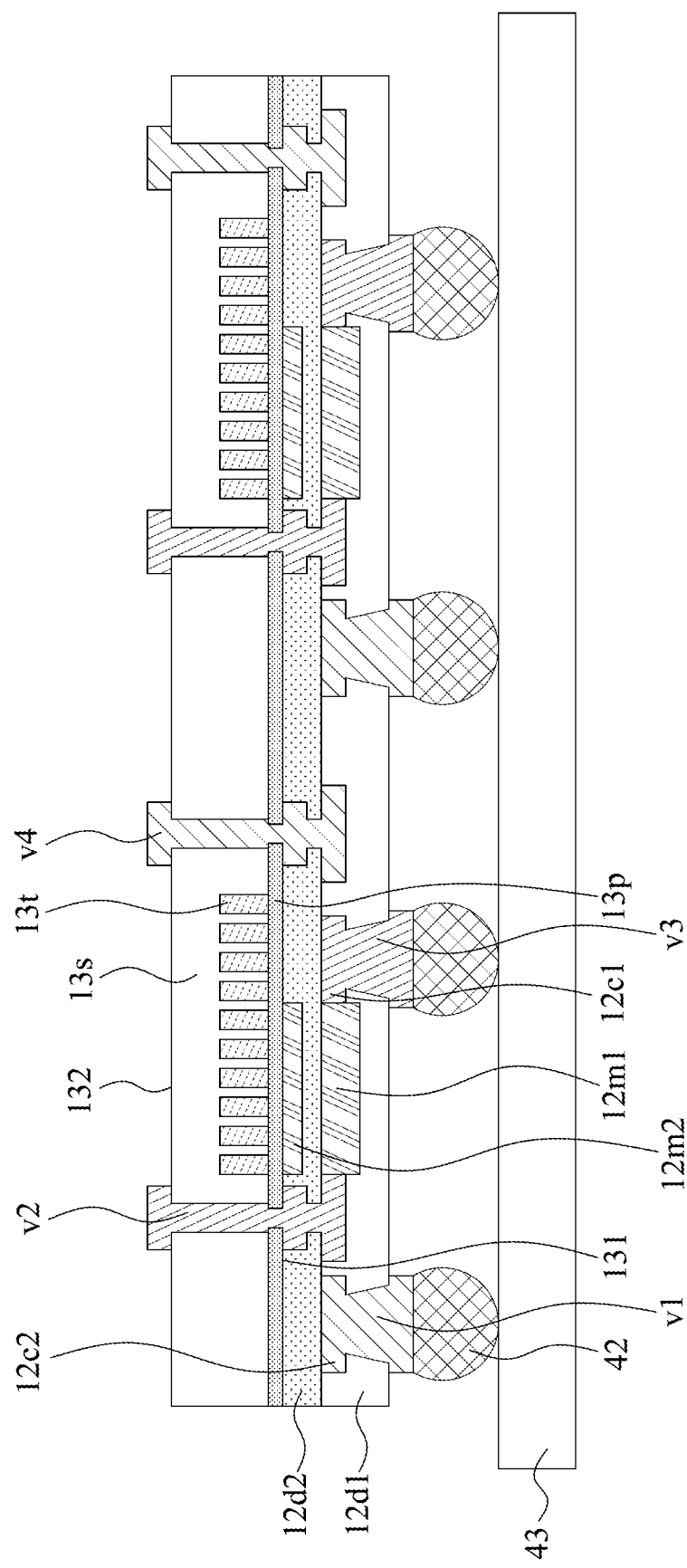

Referring to FIG. 4E, the structure obtained from the operation in FIG. 4D may be disposed on a dicing tap 43.

Figure 4F:
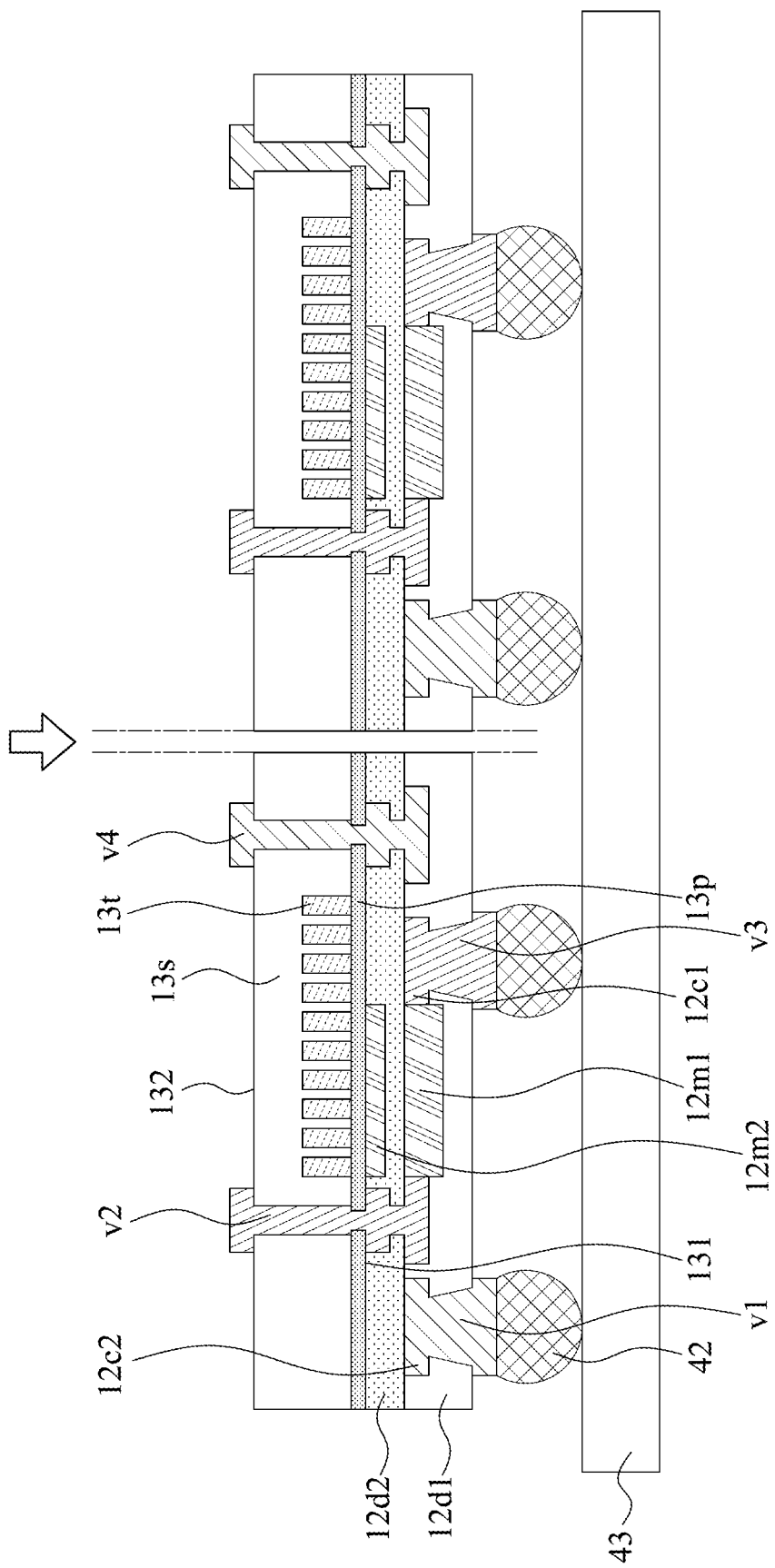

Referring to FIG. 4F, singulation may be performed to separate out individual units. That is, the singulation is performed through the substrate 13s and the dielectric layers 12d2 and 12d1. The singulation may be performed by, for example, using a dicing saw, laser or other appropriate cutting techniques.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:
   a power regulating component;
   a stacked structure comprising a first passive component and a second passive component, wherein at least a part of the stacked structure is disposed over the power regulating component and configured to receive power from the power regulating component; and
   a plurality of electronic components disposed above the stacked structure, wherein the power regulating component is configured to provide different output voltages to the plurality of electronic components through the stacked structure,
   wherein the first passive component comprises an inductance device having a first magnetic thin film, a second magnetic thin film, a first conductive element, and a second conductive element, wherein the first magnetic thin film has a vertical section and a horizontal section, and wherein the first magnetic thin film and the second magnetic thin film collectively define a space for accommodating the first conductive element and the second conductive element.

2. The electronic device of claim 1, wherein the power regulating component includes a power management integrated circuit (PMIC).

3. The electronic device of claim 1, further comprising:
   a circuit layer configured to provide a power routing path between the power regulating component and a power supply.

4. The electronic device of claim 1,
   wherein the second passive component comprises a capacitance device having a trench separated from the first passive component by a protection layer,
   wherein the capacitance device is disposed closer to the plurality of electronic components than the inductance device is,
   wherein the stacked structure further comprises:
   a first conductive via extending through the capacitance device and the protection layer, wherein the first conductive via is configured to electrically connected with the first conductive element; and
   a second conductive via extending through the capacitance device and the protection layer, wherein the first conductive via is configured to electrically connected with the second conductive element.

5. The electronic device of claim 1, wherein the first conductive element and the second conductive element are spaced apart from the first magnetic material and the second magnetic material, and wherein the first conductive element and the second conductive element are configured to transmit the different output voltages.

6. The electronic device of claim 5, wherein the inductance device further includes:
   a first dielectric layer covering the first conductive element and the second conductive element, wherein the first dielectric layer contacts the first magnetic thin film and spaced apart from the second magnetic thin film, and a second dielectric layer separating the first conductive element and the second conductive element from the second magnetic thin film, wherein the second dielectric layer contacts the first magnetic thin film, the second magnetic thin film, and the first dielectric layer.

7. The electronic device of claim 1, wherein a lateral surface of the first passive component and a lateral surface of the second passive component are substantially coplanar.

* * * * *